US012731062B2

(12) United States Patent
Shinkai et al.

(10) Patent No.: US 12,731,062 B2
(45) Date of Patent: Sep. 8, 2026

(54) QUANTUM BIT ARRAY AND QUANTUM COMPUTER

(71) Applicant: Hitachi, Ltd., Tokyo (JP)

(72) Inventors: Go Shinkai, Tokyo (JP); Digh Hisamoto, Tokyo (JP); Noriyuki Lee, Tokyo (JP)

(73) Assignee: HITACHI, LTD., Tokyo (JP)

( * ) Notice: Subject to any disclaimer, the term of this patent is extended or adjusted under 35 U.S.C. 154(b) by 785 days.

(21) Appl. No.: 18/021,213

(22) PCT Filed: Oct. 22, 2021

(86) PCT No.: PCT/JP2021/039150
§ 371 (c)(1),
(2) Date: Feb. 14, 2023

(87) PCT Pub. No.: WO2022/180929
PCT Pub. Date: Sep. 1, 2022

(65) Prior Publication Data
US 2023/0325701 A1 Oct. 12, 2023

(51) Int. Cl.
*G06N 10/40* (2022.01)
*H10N 50/20* (2023.01)

(52) U.S. Cl.
CPC ............. *G06N 10/40* (2022.01); *H10N 50/20* (2023.02)

(58) Field of Classification Search
CPC ...... G06N 10/40; H10N 50/20; H10D 30/021; H10D 30/60; H10D 48/40
See application file for complete search history.

(56) References Cited

U.S. PATENT DOCUMENTS

2002/0179897 A1* 12/2002 Eriksson ............ H10D 48/3835 257/14
2006/0011904 A1* 1/2006 Snyder .................. B82Y 20/00 257/17
(Continued)

FOREIGN PATENT DOCUMENTS

JP 2009-016767 A 1/2009
JP 2018-163495 A 10/2018
(Continued)

OTHER PUBLICATIONS

Noel H. Wan, et al., "Large-scale integration of artificial atoms in hybrid photonic", Nature, vol. 583, Jul. 9, 2020, p. 226-231.
(Continued)

*Primary Examiner* — Nha T Nguyen
(74) *Attorney, Agent, or Firm* — MATTINGLY & MALUR, PC

(57) ABSTRACT

A quantum bit array comprises a semiconductor layer, an insulating layer arranged on the semiconductor layer, and a plurality of first gate electrodes which are arranged on the insulating layer. The plurality of first gate electrodes are each configured to trap an electron having a predetermined spin state in the semiconductor layer through application of a voltage. The quantum bit array comprises means for causing, in a case where the spin state of the electron is to be changed, a current for forming a magnetic field that acts on the electron to flow through at least one of the plurality of first gate electrodes in an extending direction of the at least one of the plurality of first gate electrodes.

5 Claims, 6 Drawing Sheets

(56) References Cited

U.S. PATENT DOCUMENTS

| | | | | |
|---|---|---|---|---|
| 2013/0087766 | A1* | 4/2013 | Schenkel | H10D 48/385<br>257/31 |
| 2018/0276557 | A1 | 9/2018 | Tanamoto et al. | |
| 2018/0314967 | A1 | 11/2018 | Barends | |
| 2018/0337792 | A1* | 11/2018 | Brink | G09C 1/00 |
| 2020/0052101 | A1* | 2/2020 | Petta | H10D 62/822 |
| 2021/0296556 | A1* | 9/2021 | Hsu | H10D 48/3835 |
| 2022/0292383 | A1 | 9/2022 | Lee et al. | |

FOREIGN PATENT DOCUMENTS

| | | | |
|---|---|---|---|
| JP | 2018-534638 | A | 11/2018 |
| WO | 2006001332 | A1 | 1/2006 |
| WO | 2021024533 | A1 | 2/2021 |

OTHER PUBLICATIONS

International Search Report of PCT/JP2021/039150 dated Jan. 11, 2022.

* cited by examiner

QUANTUM BIT ARRAY AND QUANTUM COMPUTER

INCORPORATION BY REFERENCE

The present application claims priority to Japanese Patent Application No. 2021-29538 filed on Feb. 26, 2021, the content of which is incorporated herein by reference.

BACKGROUND OF THE INVENTION

This invention relates to a device for integrating quantum bits and a control method for the device.

A quantum computer is a computer which is considered to be capable of executing faster information processing as compared to existing computers. While the existing computers handle binary numbers of 0 and 1, the quantum computer has a feature in that the quantum computer can handle a superposition state of those numbers.

In order to handle the superposition state, the quantum computer requires an element called "quantum bit." The quantum bit can be achieved through use of a superconducting element and a semiconductor element. The quantum bits each have an element-specific resonant frequency, and the state of the quantum bit can be changed only when the quantum bit is irradiated with a microwave having the same frequency as the resonant frequency. The property of the quantum bit described above is used in operations of the quantum computer. For example, control of changing the state of the quantum bit, such as from 0 to 1 or from 1 to 0, is used as a NOT operation.

An actual quantum computer includes a large number of quantum bits, and the operation is required to be selectively performed on each quantum bit. In order to achieve a selective operation, it is required to prevent overlapping of the resonant frequencies of a quantum bit being a control target and a quantum bit not being the control target.

In JP 2018-534638 A, there is disclosed an apparatus for avoiding the above-mentioned problem by being designed so that the plurality of quantum bits have different fixed resonant frequencies. Further, in Noel H. Wan, et. al., Large-scale integration of artificial atoms in hybrid photonic circuits, nature 583, pp. 226-231 (2020), there is described a method of setting different resonant frequencies to respective 128 quantum bits through use of a frequency band of about 50 gigahertz.

SUMMARY OF THE INVENTION

In the control of the quantum bits, it is required to match the resonant frequency of the quantum bit with the frequency of the microwave. Meanwhile, in order to individually and selectively control each quantum bit, it is required to separate the resonant frequency of the quantum bit being the control target from the resonant frequency of another quantum bit.

The related art employs a control method of setting a resonant frequency specific to each quantum bit (hereinafter referred to as "fixed resonant frequency method"). However, frequencies are finite resources, and hence it is easy to imagine that, when the number of quantum bits to be handled is large, it becomes difficult to set different resonant frequencies to all of the quantum bits. Actually, in order to solve a practical problem, it is said that one million quantum bits are required, and it is difficult to control all of the quantum bits with the fixed resonant frequency method.

A representative example of the present invention disclosed in this specification is as follows: a quantum bit array comprises a semiconductor layer; an insulating layer arranged on the semiconductor layer; and a plurality of first gate electrodes which are arranged on the insulating layer, and are each configured to trap an electron having a predetermined spin state in the semiconductor layer through application of a voltage. The quantum bit array comprises means for causing, in a case where the spin state of the electron is to be changed, a current for forming a magnetic field that acts on the electron to flow through at least one of the plurality of first gate electrodes in an extending direction of the at least one of the plurality of first gate electrodes.

The quantum bit array in which a plurality of quantum bits are integrated can be achieved. Other problems, configurations, and effects than those described above will become apparent in the descriptions of embodiments below.

BRIEF DESCRIPTION OF THE DRAWINGS

The present invention can be appreciated by the description which follows in conjunction with the following figures, wherein.

DETAILED DESCRIPTION OF THE PREFERRED EMBODIMENTS

Figure 1:
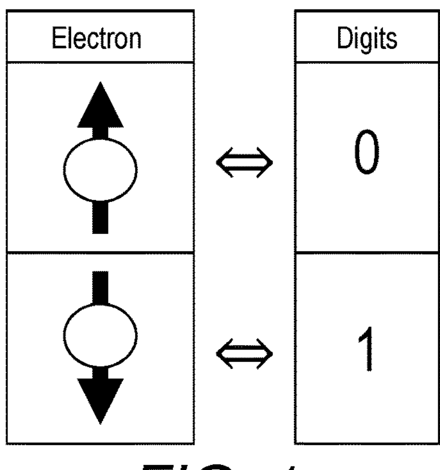
FIG. 1 is a diagram for illustrating an electron spin which is the state of a quantum bit.

Now, a detailed description is given of embodiments of this invention referring to the drawings. It should be noted that this invention is not to be construed by limiting the invention to the content described in the following embodiments. A person skilled in the art would easily recognize that a specific configuration described in the following embodiments may be changed within the scope of the concept and the gist of this invention.

In the configuration of the invention to be described below, identical parts or parts having similar functions are designated by identical reference symbols across different drawings, and a redundant description may be omitted. When there are a plurality of elements having identical or similar functions, in some cases, those elements may be described with different suffixes being attached. However, in some cases, those elements may be described with the suffixes being omitted.

Notations of, for example, "first," "second," and "third" herein are assigned to distinguish between components, and do not necessarily limit the number, order, or content of those components. Further, numbers for identifying components are used for each context, and numbers used in one context do not always indicate the same configuration in other contexts. Further, such numbers do not prevent the component identified by a certain number from having a function of a component identified by another number.

The position, size, shape, range, and others of each component illustrated in, for example, the drawings may not represent the actual position, size, shape, range, and other metrics in order to facilitate understanding of this invention. Thus, this invention is not necessarily limited to the position, size, shape, range, and others described in, for example, the drawings.

A quantum bit is a basic information unit of a quantum computer, and is also a physical component of the quantum computer. As described above in the "BACKGROUND OF THE INVENTION" section, the quantum bit can be achieved through use of a superconducting element and a semiconductor element, or the like. The state of the quantum bit is controlled through use of a microwave having a frequency matching a resonant frequency of a quantum bit being a control target. In the following, description is given assuming a quantum computer including a quantum bit array employing a method using an electron spin as the state of the quantum bit.

First Embodiment

FIG. 1 is a diagram for illustrating the electron spin which is the state of the quantum bit.

A symbol formed of a circle and an arrow is an image diagram of the electron spin. The electron spin is expressed as a vector. The basis of the vector is a downward state (down state) and an upward state (up state) of the spin, and, for example, each state is associated with numerical values of "0" and "1".

Control of the electron spin such as changing the spin state associated with the numerical values from, for example, the up state to the down state corresponds to an operation in the quantum computer.

As a feature of the quantum bit, a superposition state of the up state and the down state can be created. It is impossible for classical computers to handle the superposition state of 0 and 1, and handling the superposition state is one feature of the quantum computer.

As described above, the operation in the quantum computer is implemented by the control of the electron spin. The control of the electron spin uses an electron spin resonance phenomenon. In the electron spin resonance phenomenon, a static magnetic field and an oscillating magnetic field are used to control the electron spin. The magnitude of the static magnetic field relates to the frequency of the oscillating magnetic field to which the electron spin reacts. The amplitude of the oscillating magnetic field is dependent on the speed of the electron spin flipping between the up state and the down state.

In the operation of the quantum computer, it is required to control only a quantum bit being a control target among a large number of quantum bits. In order to control only a desired quantum bit, it is required that a frequency to which the desired quantum bit reacts (hereinafter referred to as "resonant frequency") and the resonant frequency of the quantum bit not being the control target be different from each other.

In the fixed resonant frequency method in the related art, in order to meet the above-mentioned requirement, different resonant frequencies are set to the respective quantum bits. However, frequencies are finite resources, and in a case of a quantum computer including a large number of quantum bits, it is difficult to assign different resonant frequencies to all of the quantum bits.

A quantum computer according to a first embodiment of this invention employs a dynamic resonant frequency changing method. In the dynamic resonant frequency changing method, instead of setting different resonant frequencies to the respective quantum bits, at the time of control, the resonant frequency of the quantum bit being the control target is set so as to be different from that of another quantum bit.

Figure 2:
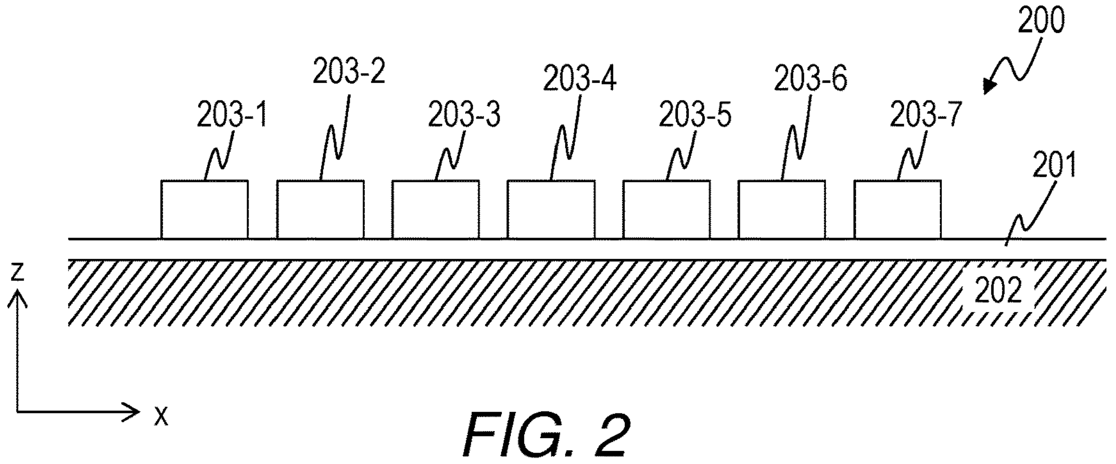
FIG. 2 is a cross-sectional view for illustrating a quantum bit array according to a first embodiment.

FIG. 2 is a cross-sectional view for illustrating a quantum bit array according to the first embodiment.

A quantum bit array 200 is a device for achieving quantum bits employing an electron spin method, and has the cross-sectional structure as illustrated in FIG. 2.

A cross section of the quantum bit array 200 has the metal oxide insulator (MOS) structure including a semiconductor layer 202, an insulating layer 201, and a gate electrode layer formed of a plurality of gate electrodes 203. It should be noted that the cross-sectional view is a schematic view in which a part of the quantum bit array 200 is enlarged, and an actual gate dimension and thickness of each layer do not represent the actual dimensions.

In FIG. 2, seven gate electrodes 203-1, 203-2, 203-3, 203-4, 203-5, 203-6, and 203-7 are illustrated as the gate electrodes 203 for forming the gate electrode layer. When a voltage is applied to the gate electrode 203, an electrostatic effect is caused so that an electron can be trapped in the vicinity of a boundary between the insulating layer 201 and the semiconductor layer 202 below the gate electrode 203. For example, when a voltage is applied to the gate electrode 203-4, an electrostatic attractive force is caused so that an electron is trapped in the semiconductor layer 202 below the gate electrode 203-4 across the insulating layer 201. In the quantum bit array 200, the trapped electron is used as the quantum bit.

As described above, when the frequency of the generated oscillating magnetic field matches the resonant frequency of the electron, the electron spin is flipped. In FIG. 2, the structure for generating the oscillating magnetic field is omitted.

In the following, description is given assuming the quantum bit array 200 having the structure of FIG. 2, but the structure of the quantum bit array 200 is not limited to the structure illustrated in FIG. 2.

This invention is applicable to any general quantum bit array having the structure in which electrons are to be trapped owing to the electrostatic effect.

The resonant frequency of the trapped electron is determined based on the magnitude of the static magnetic field to be applied to the electron. Accordingly, local modulation of the magnitude of the static magnetic field is important for the operation of the quantum computer. Description is given of a local modulation method for the magnitude of the static magnetic field.

Figure 3:
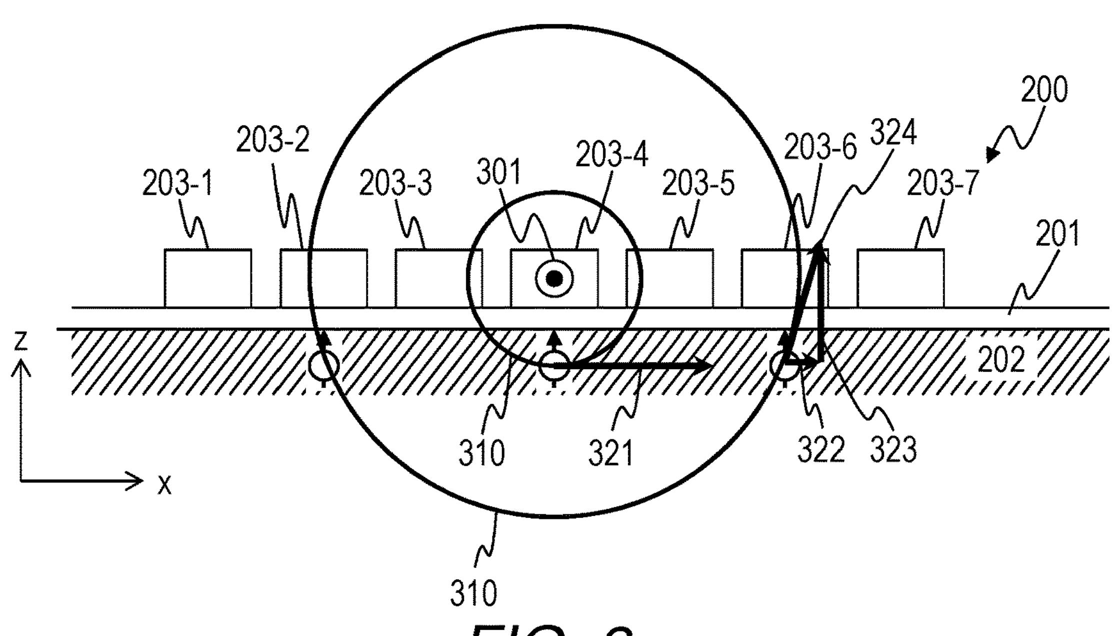
FIG. 3 is a diagram for illustrating a resonant frequency control method in the quantum bit array according to the first embodiment.

FIG. 3 is a diagram for illustrating a resonant frequency control method in the quantum bit array according to the first embodiment.

In FIG. 3, one electron is trapped right below each of the gate electrodes 203-2, 203-4, and 203-6 to which the voltage is applied. In order to implement the operation of the quantum computer, it is required to selectively control the electron trapped below each of the gate electrodes 203-2, 203-4, and 203-6. In FIG. 3, description is given of the control method in a case in which the electron trapped below the gate electrode 203-4 is the control target.

In general, the gate electrode of the device having the MOS structure does not expect a DC current to flow therethrough. In the first embodiment, a DC current 301 is caused to flow through the gate electrode 203-4 for trapping the electron of the control target so that a magnetic field is generated around the gate electrode 203-4. The DC current 301 is assumed to flow in a direction from the depth side to the front side of the drawing sheet. The magnetic field generated by the DC current 301 flowing through the gate electrode 203-4 is referred to as "generated magnetic field."

A circle 310 expresses a line of a magnetic force of the generated magnetic field. A magnetic field as indicated by an arrow 321 acts on the electron trapped below the gate electrode 203-4. Further, a magnetic field as indicated by an arrow 324 acts on the electron trapped below the gate electrode 203-6. An arrow 322 indicates an X component of the magnetic field 324, and an arrow 323 indicates a Z component of the magnetic field 324.

When an external magnetic field is generated through use of a magnetic field generating source which is not shown in FIG. 3, a magnetic field obtained by combining the external magnetic field and the generated magnetic field acts on the trapped electron. In this case, the direction of the external magnetic field is assumed to be an X direction.

The generated magnetic field and the external magnetic field which act on the electron trapped below the gate electrode 203-4 are both in the X direction, and hence the resonant frequency of the electron is determined based on the sum of the two magnetic fields. The generated magnetic field that acts on the electron trapped below the gate electrode 203-6 is not in parallel to the X direction, and hence the resonant frequency of the electron is approximately determined based on the sum of the X direction of the generated magnetic field and the external magnetic field.

As described above, the resonant frequency of the electron trapped below each gate electrode 203 is different depending on the magnitude of the X component of the generated magnetic field. The change amount of the resonant frequency exponentially decays with respect to the distance from the gate electrode 203 through which the DC current 301 flows. With the effect of the exponential decay, the resonant frequency of the electron trapped below the gate electrode 203-4 can be clearly distinguished from the resonant frequency of the electron trapped below another gate electrode 203.

Figure 4:
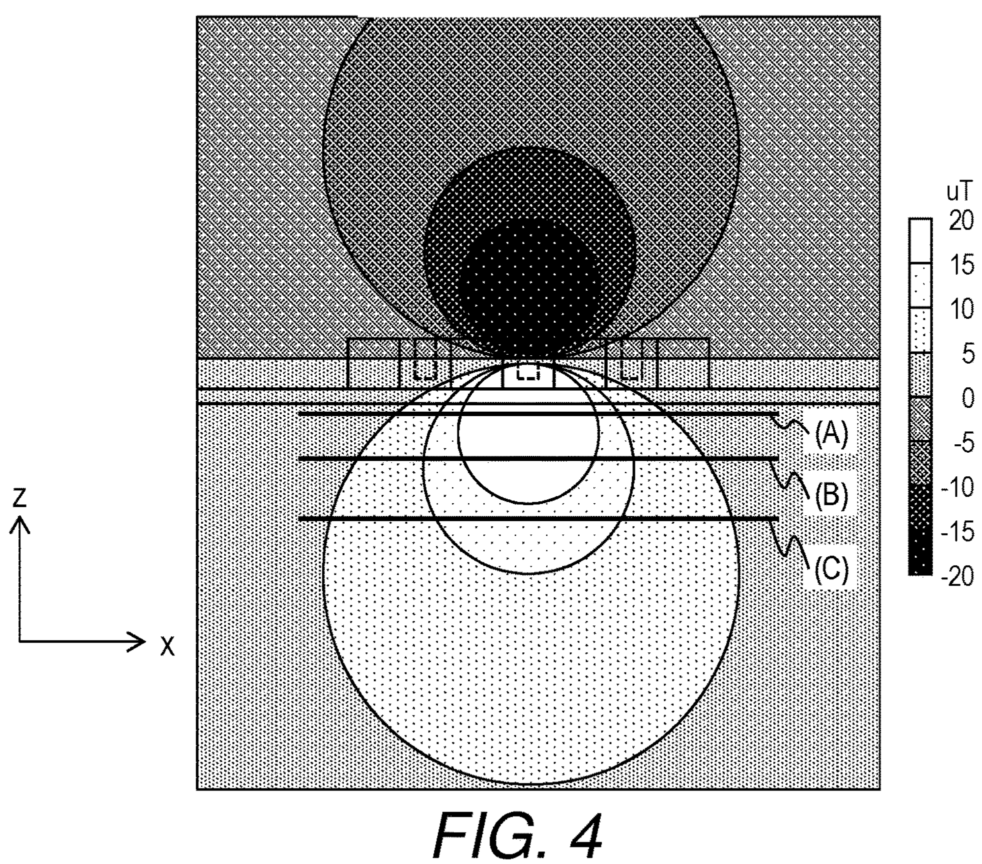
FIG. 4 and FIG. 5 are diagrams for showing simulation results of a magnetic field caused by a DC current of a gate electrode in the quantum bit array according to the first embodiment.
Figure 5:
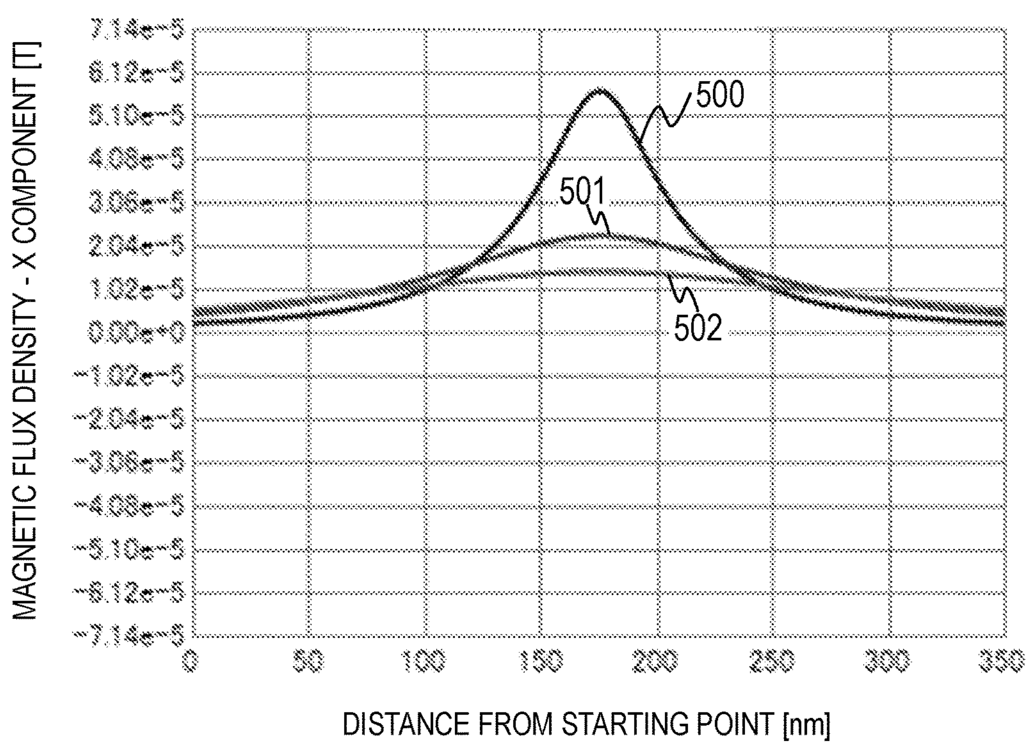

FIG. 4 and FIG. 5 are diagrams for showing simulation results of the magnetic field caused by the DC current of the gate electrode in the quantum bit array according to the first embodiment.

FIG. 4 shows the magnitude of the X component of the magnetic field generated by the DC current at each point in the cross section, which was estimated through use of a magnetic field simulator assuming typical dimensions. A DC current of 10 microamperes flows through the gate electrode 203-4.

FIG. 5 shows graphs 500, 501, and 502 of the magnitude of the X component of the magnetic field along the straight lines (A), (B), and (C) of FIG. 4, respectively. The magnitude of the resonant frequency of the quantum bit is indicated through use of a unit hertz of (Expression 1).

(Expression 1)

$$f=\alpha\times B \tag{1}$$

In (Expression 1), B represents a magnetic field (in units of tesla) acting on the quantum bit (electron), and f represents a resonant frequency (in units of hertz) of the quantum bit. Symbol $\alpha$ represents a conversion coefficient, and is set to "$28.025\times10^9$" in this case.

The graph 500 indicates the X component of the generated magnetic field in the surface (straight line (A)) of the semiconductor layer 202 of the quantum bit array 200. The X component of the generated magnetic field is largest at the position of the gate electrode 203-4. Next, the X component of the generated magnetic field is large at the positions of the gate electrodes 203-2 and 203-6. The electron of the gate electrode 203-4 has a resonant frequency that is larger by about 20 megahertz as compared to the resonant frequencies of the electrons of the gate electrodes 203-2 and 203-6. In order to distinguish the quantum bits through use of the resonant frequencies, a difference of at least several megahertz is required. Accordingly, the obtained difference of the resonant frequencies satisfies the above-mentioned condition.

Figure 6A:
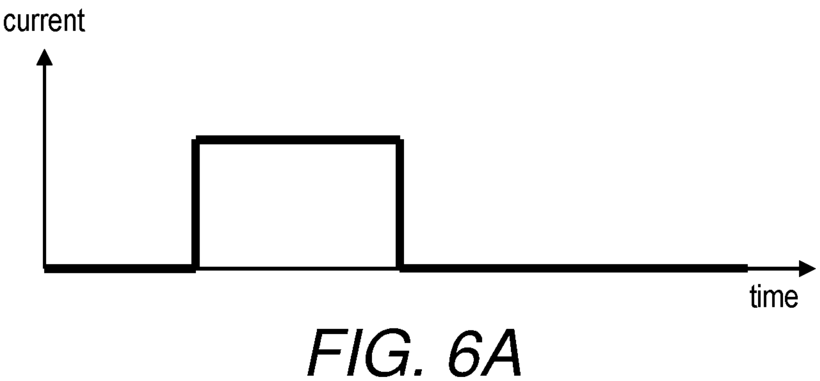
FIG. 6A and FIG. 6B are charts for showing a time-varying pattern of the DC current in the quantum bit array according to the first embodiment.
Figure 6B:
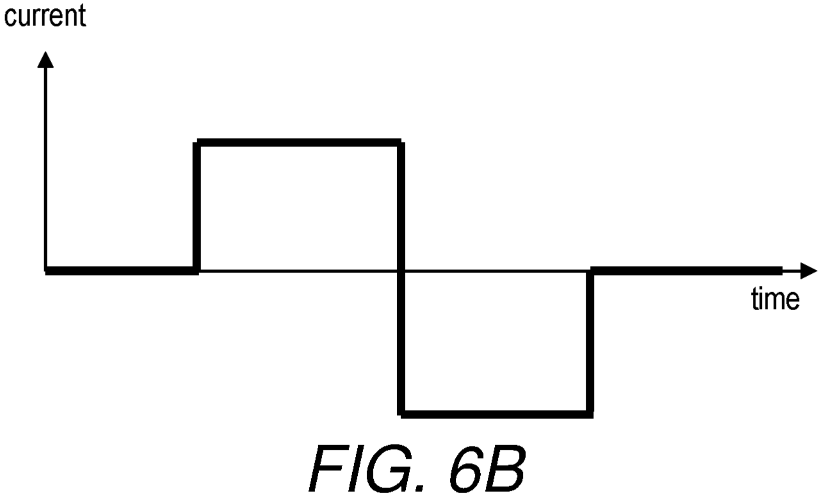

FIG. 6A and FIG. 6B are charts for showing a time-varying pattern of the DC current in the quantum bit array according to the first embodiment.

In the time-varying pattern of the DC current of FIG. 6A, three states of "current off," "current on," and "current off" are switched along with the elapse of time. A period of time of "current on" is a period in which the difference of the resonant frequencies of the quantum bits is generated. As described above, the resonant frequency can be dynamically switched by switching the on/off of the current.

In the time-varying pattern of the DC current of FIG. 6B, four states of "current off," "current on," "current on," and "current off" are switched along with the elapse of time. A period of time of the first "current on" is a period in which the difference of the resonant frequencies of the quantum bits is generated. A period of time of the second "current on" is a period in which a current is caused to flow in a direction opposite to that in the period of time of the first "current on." In this manner, the influence of the generated magnetic field on the quantum bit not being the control target can be suppressed.

The feature of the control method in the first embodiment resides in that the resonant frequency of the electron being the control target is dynamically changed at the time of control so as to allow this resonant frequency to be distinguished from the resonant frequency of another electron. The control method in the first embodiment is referred to as "dynamic resonant frequency changing method." The dynamic frequency changing method in the first embodiment is also referred to as "one-wire dynamic frequency changing method."

The dynamic resonant frequency changing method described in the first embodiment can solve problems caused due to integration of quantum bits, which cannot be solved by the fixed resonant frequency method.

The dynamic resonant frequency changing method in the first embodiment is referred to as "one-wire dynamic resonant frequency changing method" in order to distinguish this dynamic resonant frequency changing method from dynamic resonant frequency changing methods described in the following embodiments.

Second Embodiment

In a second embodiment of this invention, description is given of a dynamic resonance frequency changing method (two-wire dynamic resonant frequency changing method) that is different from that in the first embodiment.

Figure 7:
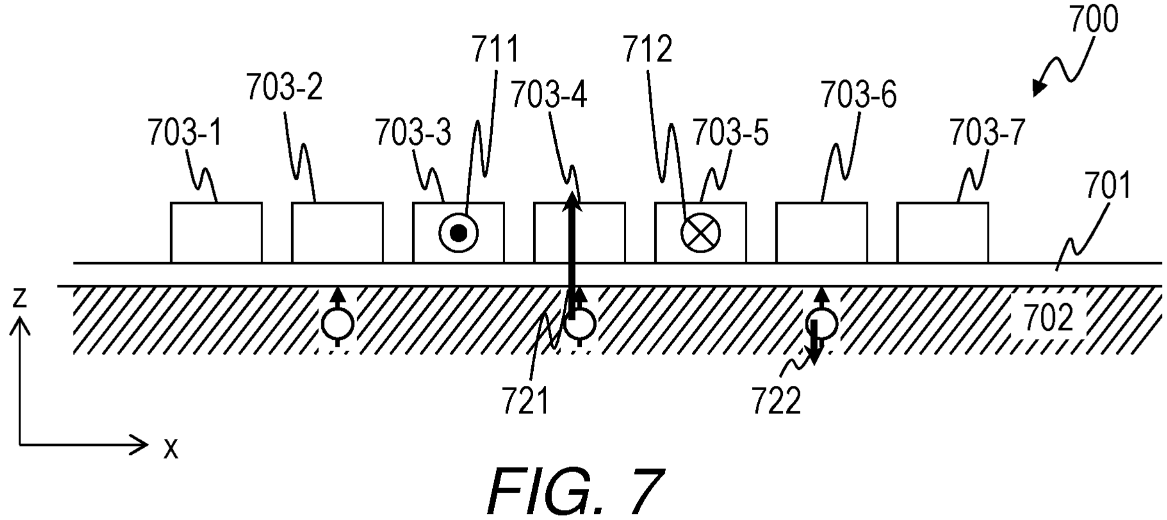
FIG. 7 is a cross-sectional view for illustrating a quantum bit array according to a second embodiment.

FIG. 7 is a cross-sectional view for illustrating a quantum bit array according to the second embodiment.

A quantum bit array 700 according to the second embodiment has the same configuration as that of the quantum bit array 200 according to the first embodiment. The cross section of the quantum bit array 700 has the MOS structure including a semiconductor layer 702, an insulating layer 701, and a gate electrode layer.

In FIG. 7, seven gate electrodes 703-1, 703-2, 703-3, 703-4, 703-5, 703-6, and 703-7 are illustrated as the gate electrodes 703 for forming the gate electrode layer.

In FIG. 7, description is given of a control method in a case in which an electron trapped below the gate electrode 703-4 is assumed as the control target.

In the second embodiment, currents are caused to flow in different directions through two gate electrodes 703-3 and 703-5, which are adjacent on both sides to the gate electrode 703-4 for trapping the electron being the control target. In FIG. 7, a DC current 711 is caused to flow through the gate electrode 703-3 in a direction from the depth side to the front side of the drawing sheet, and a DC current 712 is caused to flow through the gate electrode 703-5 in a direction from the front side to the depth side of the drawing sheet. The gate electrodes 703 through which the currents are caused to flow are not required to be the gate electrodes 703 adjacent on both sides to the gate electrode 703-4 for trapping the electron being the control target.

A generated magnetic field is generated around each of the DC currents 711 and 712. An external magnetic field and a magnetic field (combined magnetic field) obtained by combining the two generated magnetic fields act on the electron trapped below the gate electrode 703. A combined magnetic field parallel to the Z axis acts on the electron trapped below the gate electrode 703-4. In this case, it is assumed that the direction of the external magnetic field is a Z direction.

When the external magnetic field is sufficiently larger than the combined magnetic field, the Z component of the combined magnetic field mainly affects the resonant frequency of the quantum bit. With respect to the electron trapped below the gate electrode 703-4, the generated magnetic field of the DC current 711 and the generated magnetic field of the DC current 712 are combined so as to reinforce each other in the Z direction an arrow 721. Meanwhile, with respect to the electron trapped below the gate electrode 703-6, the generated magnetic field of the DC current 711 and the generated magnetic field of the DC current 712 are combined so as to weaken each other an arrow 722. With the effect of combining two generated magnetic fields as described above, the magnetic field that acts on the electron trapped below the gate electrode 703-4 is locally increased. As a result, the difference of the resonant frequencies between the quantum bits is increased.

The localness of the magnetic field generated in the second embodiment appears more notably as compared to the localness of the magnetic field generated in the first embodiment. Accordingly, the difference of the resonant frequencies between the quantum bits is notably increased.

Figure 8:
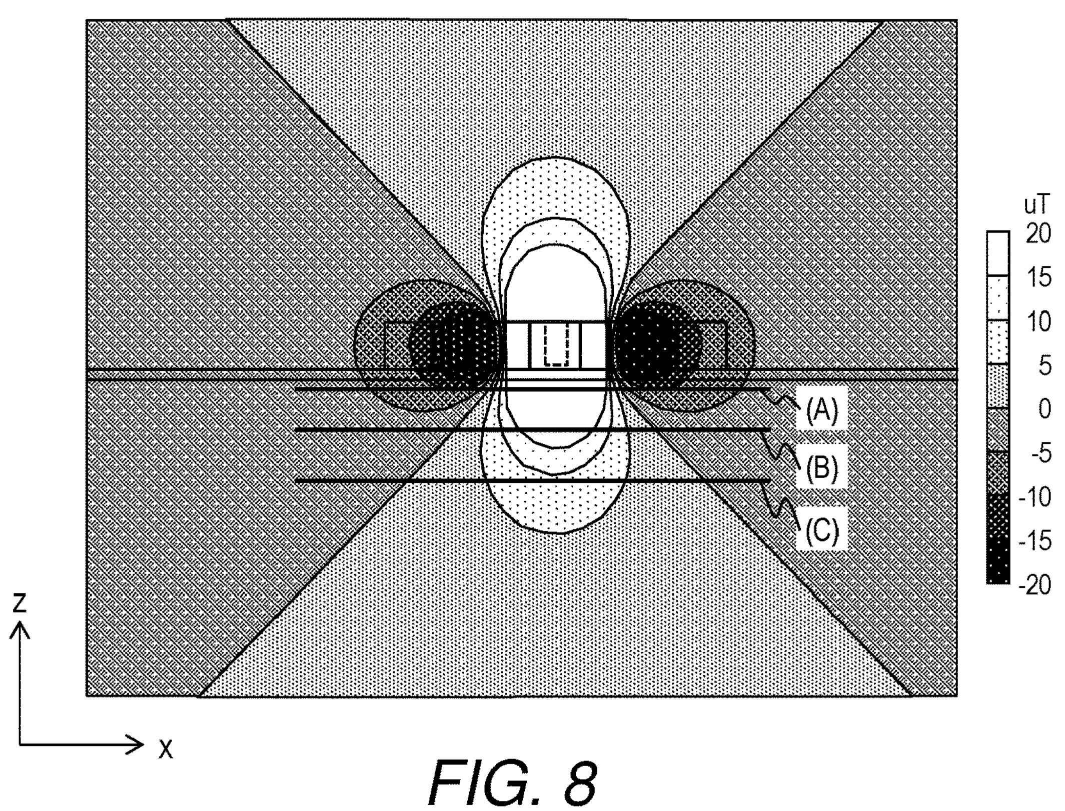
FIG. 8 and FIG. 9 are diagrams for showing simulation results of the magnetic field caused by the DC current of the gate electrode in the quantum bit array according to the second embodiment.
Figure 9:
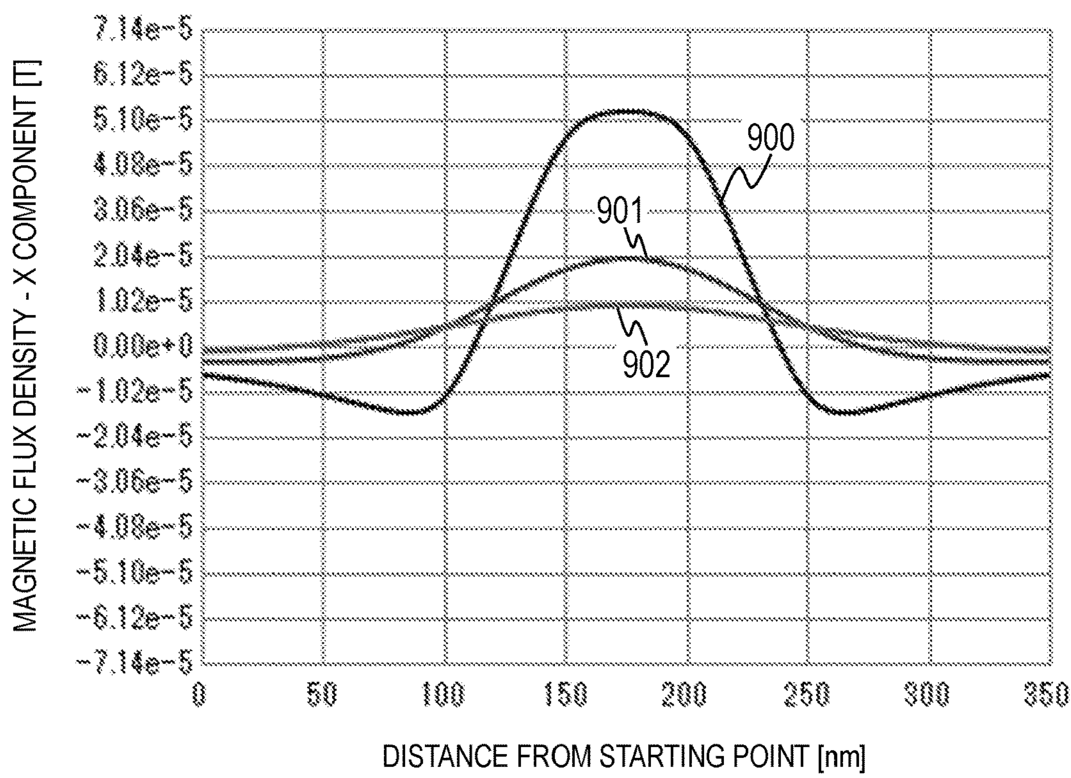

FIG. 8 and FIG. 9 are diagrams for showing simulation results of the magnetic field caused by the DC current of the gate electrode in the quantum bit array according to the second embodiment.

FIG. 8 shows the magnitude of the Z component of the magnetic field generated by two DC currents at each point in the cross section. A DC current of 10 microamperes flows through each of the gate electrodes 703-3 and 703-5.

FIG. 9 shows graphs 900, 901, and 902 of the magnitude of the Z component of the magnetic field along the straight lines (A), (B), and (C) of FIG. 8, respectively.

The dynamic resonant frequency changing method described in the second embodiment can solve the problem caused due to the integration of the quantum bits, which cannot be solved by the fixed resonant frequency method. Further, the dynamic resonant frequency changing method in the second embodiment can increase the difference of the resonant frequencies as compared to the one-wire dynamic resonant frequency changing method.

Third Embodiment

In a third embodiment of this invention, description is given of a quantum bit array for achieving a two-dimensional quantum bit arrangement.

Figure 10A:
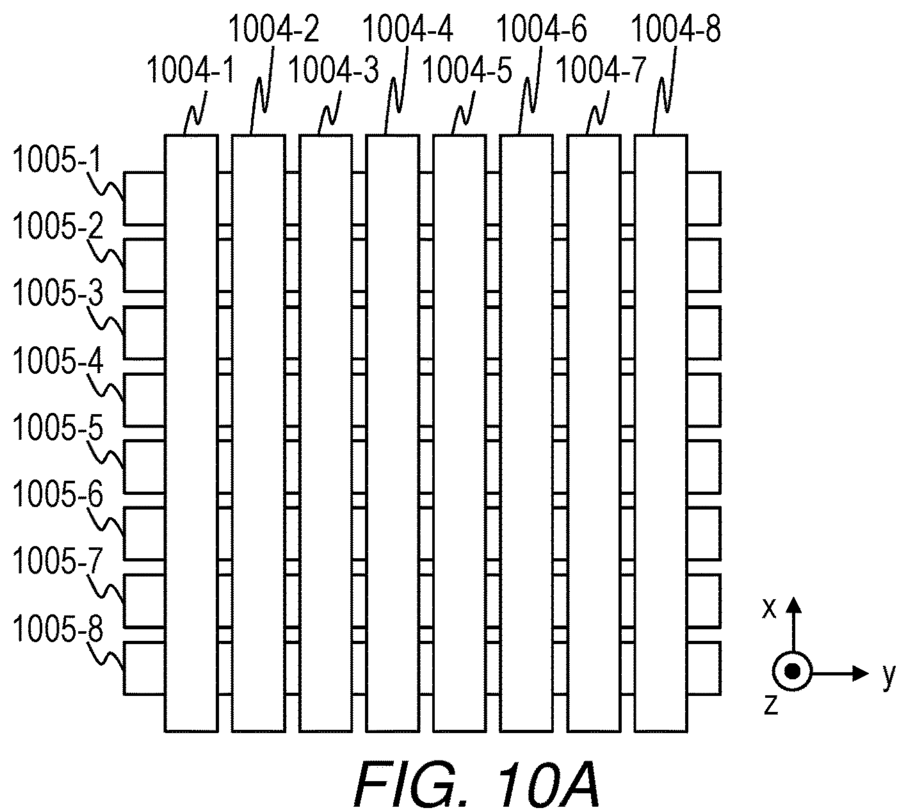
FIG. 10A and FIG. 10B are views for illustrating an arrangement of gate electrodes in the quantum bit array according to a third embodiment.
Figure 10B:
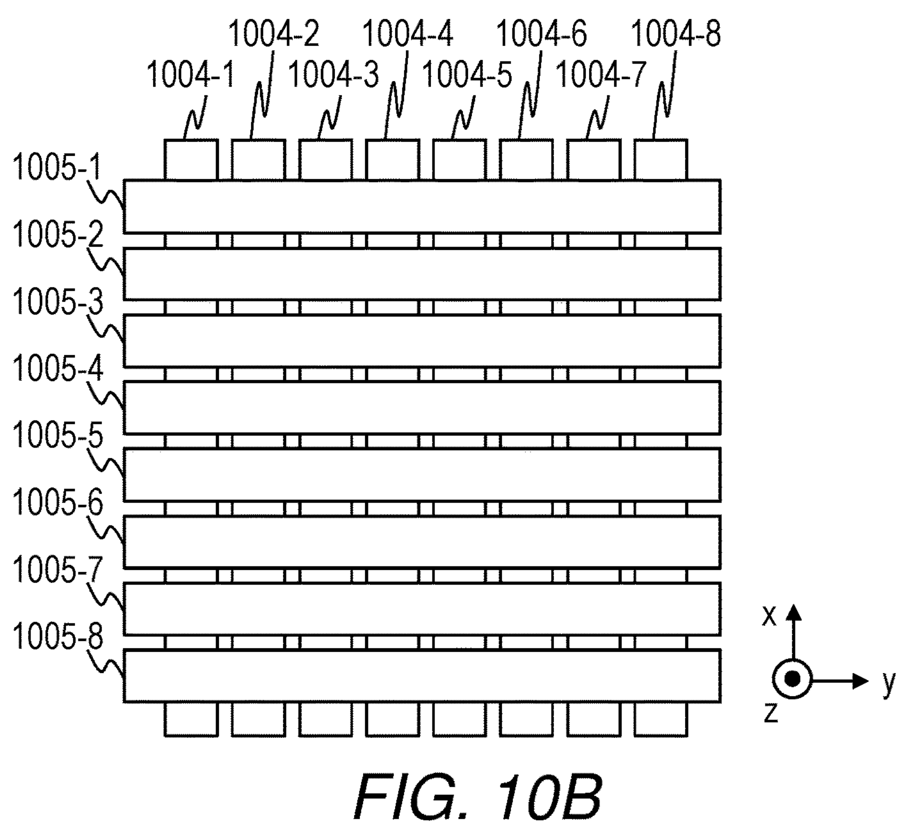
Figure 11:
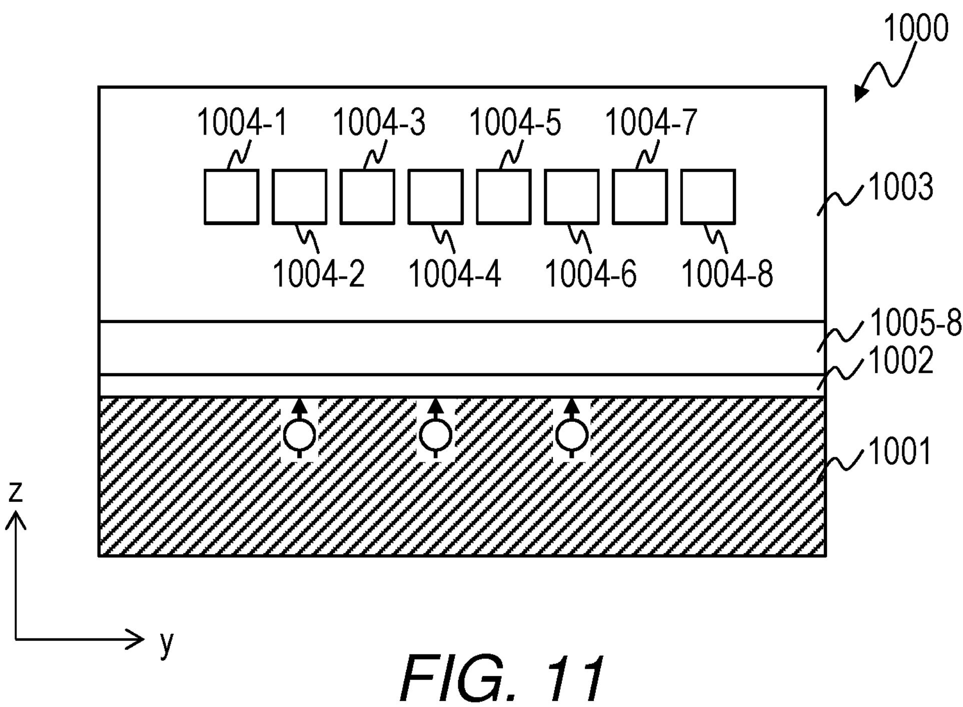
FIG. 11 is a cross-sectional view of the quantum bit array according to the third embodiment.

FIG. 10A and FIG. 10B are views for illustrating an arrangement of gate electrodes in the quantum bit array according to the third embodiment. FIG. 11 is a cross-sectional view of the quantum bit array according to the third embodiment.

A quantum bit array 1000 has the structure for achieving the two-dimensional electron bit arrangement, and includes gate electrodes 1004 arranged in a Y direction and gate electrodes 1005 arranged in the X direction. In FIG. 10A, the gate electrodes 1004 are arranged in a layer higher than a layer of the gate electrodes 1005, and, in FIG. 10B, the gate electrodes 1005 are arranged in a layer higher than the layer of the gate electrodes 1004.

FIG. 11 is a cross-sectional view of the quantum bit array 1000 having an arrangement relationship of the gate electrodes 1004 and 1005 of FIG. 10A. The quantum bit array 1000 includes a semiconductor layer 1001, insulating layers 1002 and 1003, the gate electrodes 1004, and the gate electrodes 1005. The gate electrodes 1004 are included inside of the insulating layer 1003.

When a DC current is caused to flow through one or a plurality of gate electrodes 1004, the resonant frequency of the quantum bit can be varied in the Y direction. When a DC current is caused to flow through one or a plurality of gate electrodes 1005, the resonant frequency of the quantum bit can be varied in the X direction.

The semiconductor layer 1001 is not limited to a bulk semiconductor. In order to confine the quantum bit within an XY plane, the semiconductor layer 1001 may be patterned with an insulator so as to form a channel. As the shape of the channel, various shapes, such as a lattice shape and a staggered shape, are conceivable, but the shape is not limited herein.

Fourth Embodiment

In a fourth embodiment of this invention, description is given of a quantum bit array for achieving a two-dimensional quantum bit arrangement.

The arrangement of the gate electrodes of the quantum bit array according to the fourth embodiment is similar to that in the third embodiment, and hence description thereof is omitted.

Figure 12:
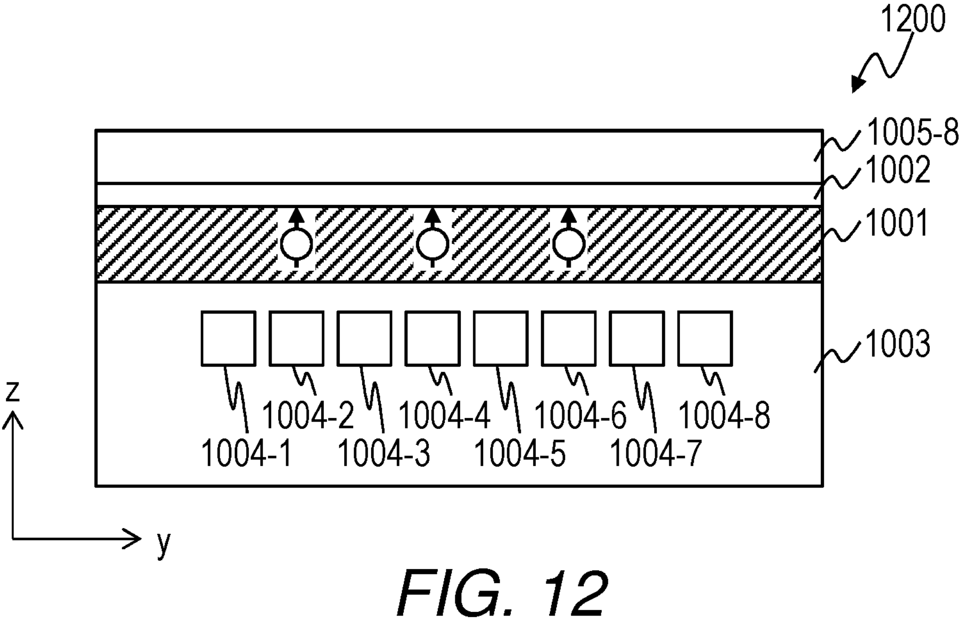
FIG. 12 is a cross-sectional view for illustrating the quantum bit array according to a fourth embodiment.

FIG. 12 is a cross-sectional view for illustrating the quantum bit array according to the fourth embodiment.

FIG. 12 is a cross-sectional view of a quantum bit array 1200 having an arrangement relationship of the gate electrodes 1004 and 1005 of FIG. 10B. The quantum bit array 1200 includes the semiconductor layer 1001, the insulating layers 1002 and 1003, the gate electrodes 1004, and the gate electrodes 1005. The gate electrodes 1004 are included inside of the insulating layer 1003.

From the viewpoint of magnetic field application, the gate electrodes are desired to be arranged near the quantum bits. In view of the above, the quantum bit array 1200 according to the fourth embodiment has the sandwich structure in which the semiconductor layer 1001 is arranged between the gate electrodes 1004 and the gate electrodes 1005.

What is claimed is:

1. A quantum bit array, comprising:

a semiconductor layer;

an insulating layer arranged on the semiconductor layer;

a plurality of first gate electrodes which are arranged on the insulating layer, and are each configured to trap an electron in the semiconductor layer through application of a voltage, wherein a DC current forms a magnetic field that acts on the electron to flow through at least one of the plurality of first gate electrodes in an extending direction of the at least one of the plurality of first gate electrodes, wherein, when the DC currents are passed through the two of the plurality of first gate electrodes, the DC currents pass in opposite directions.

2. The quantum bit array according to claim 1, further comprising:

a plurality of second gate electrodes, wherein a DC current forming a magnetic field that acts on the electron flows through at least one of the plurality of second gate electrodes in an extending direction of the at least one of the plurality of second gate electrodes, wherein the quantum bit array is configured to control, in a case where the spin state of the electron is to be changed, a DC current so that the DC current flows through at least one of one or two of the plurality of first gate electrodes or one or two of the plurality of second gate electrodes, wherein the plurality of second gate electrodes are arranged above the plurality of first gate electrodes or inside of the insulating layer, and wherein the quantum bit array passes the DC currents in opposite directions. when the DC currents are passed through the two second gate electrodes to change the spin state of the electrons.

3. The quantum bit array according to claim 2, wherein the plurality of first gate electrodes form a pattern in a predetermined direction, wherein the plurality of second gate electrodes form a pattern in a predetermined direction, and wherein the plurality of first gate electrodes and the plurality of second gate electrodes are arranged so that the predetermined direction of the pattern formed by the plurality of first gate electrodes and the predetermined direction of the pattern formed by the plurality of second gate electrodes are substantially orthogonal to each other.

4. The quantum bit array according to claim 2, wherein the quantum bit array is configured to control the DC current flowing through each of the at least one of the plurality of first gate electrodes and the at least one of the plurality of second gate electrodes so that the DC current varies over time in a certain pattern.

5. A quantum computer, comprising the quantum bit array of claim 1.

* * * * *